US009294133B1

(12) United States Patent
Xie et al.

(10) Patent No.: US 9,294,133 B1
(45) Date of Patent: Mar. 22, 2016

(54) METHOD AND APPARATUS FOR ERROR CORRECTION (71) Applicant: MARVELL INTERNATIONAL LTD., Hamilton (BM)

(72) Inventors: Jin Xie, Longmont, CO (US); Mats Oberg, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 142 days.

(21) Appl. No.: 14/161,354

(22) Filed: Jan. 22, 2014

Related U.S. Application Data (60) Provisional application No. 61/757,867, filed on Jan. 29, 2013.

(51) Int. Cl.
| | |
|---|---|
| H03M 13/29 | (2006.01) |
| H03M 13/15 | (2006.01) |
| H03M 13/37 | (2006.01) |
| H03M 13/11 | (2006.01) |
| H03M 13/45 | (2006.01) |
| H03M 13/41 | (2006.01) |
| G11B 5/09 | (2006.01) |
| G11B 20/18 | (2006.01) |
| G06F 11/10 | (2006.01) |

(52) U.S. Cl.
CPC ......... *H03M 13/293* (2013.01); *G06F 11/1068* (2013.01); *G11B 5/09* (2013.01); *G11B 20/18* (2013.01); *H03M 13/1105* (2013.01); *H03M 13/154* (2013.01); *H03M 13/1515* (2013.01); *H03M 13/29* (2013.01); *H03M 13/2906* (2013.01); *H03M 13/2948* (2013.01); *H03M 13/37* (2013.01); *H03M 13/373* (2013.01); *H03M 13/3746* (2013.01); *H03M 13/4138* (2013.01); *H03M 13/455* (2013.01)

(58) Field of Classification Search
CPC ............ H03M 13/1515; H03M 13/29; H03M 13/293; H03M 13/2948; H03M 13/373; H03M 13/154; H03M 13/1105; H03M 13/37; H03M 13/3746; H03M 13/4138; H03M 13/455; G11B 20/18; G11B 2220/2541; G11B 2220/20; G11B 2220/2516; G11B 5/09; G06F 11/1068
USPC .......... 714/758, 755, 763, 774, E11.032, 746, 714/751, 752, 780, 784, 795, 799, 804
See application file for complete search history.

(56) References Cited

U.S. PATENT DOCUMENTS

| | | | | |
|---|---|---|---|---|
| 5,696,774 | A * | 12/1997 | Inoue et al. | 714/755 |
| 5,781,565 | A * | 7/1998 | Sako et al. | 714/755 |
| 5,907,660 | A * | 5/1999 | Inoue et al. | 386/264 |
| 6,043,946 | A * | 3/2000 | Genheimer et al. | 360/53 |
| 6,240,538 | B1 * | 5/2001 | Dent et al. | 714/762 |
| 6,272,659 | B1 * | 8/2001 | Zook | 714/774 |

(Continued)

OTHER PUBLICATIONS

Dou et al., Erasure and Error-Correcting Decoding Algorithm for Spread Spectrum Systems with Partial-Time Interference, Aug. 1985, IEEE, pp. 858-862.*

*Primary Examiner* — John J Tabone, Jr.

(57) ABSTRACT

Aspects of the disclosure provide a method for error correction. The method includes error-correction code (ECC) decoding a first code word of code words in a data block, determining erasures for a second code word of the code words in the data block based on corrections in the first code word by the ECC decoding, and ECC decoding the second code word with the erasures.

19 Claims, 4 Drawing Sheets

(56) References Cited

U.S. PATENT DOCUMENTS

| | | | |
|---|---|---|---|
| 6,895,173 B2 * | 5/2005 | Choi | 386/204 |
| 6,986,092 B2 * | 1/2006 | Butler et al. | 714/752 |
| 7,281,193 B2 * | 10/2007 | Wu et al. | 714/758 |
| 7,843,660 B1 * | 11/2010 | Yeo | 360/53 |
| 8,015,475 B2 * | 9/2011 | Lu et al. | 714/784 |
| 8,032,812 B1 * | 10/2011 | Yang et al. | 714/755 |
| 8,069,398 B2 * | 11/2011 | Wu et al. | 714/776 |
| 8,196,004 B1 * | 6/2012 | Tang | 714/755 |
| 8,671,328 B2 * | 3/2014 | Oberg et al. | 714/763 |
| 8,892,977 B2 * | 11/2014 | Murakami et al. | 714/751 |
| 2003/0051201 A1 * | 3/2003 | Brenna | 714/763 |
| 2006/0069979 A1 * | 3/2006 | Wu et al. | 714/758 |
| 2007/0226582 A1 * | 9/2007 | Tang et al. | 714/758 |
| 2010/0077279 A1 * | 3/2010 | Kim et al. | 714/755 |
| 2011/0087948 A1 * | 4/2011 | Murakami et al. | 714/758 |
| 2011/0167323 A1 * | 7/2011 | Yu et al. | 714/795 |
| 2011/0264984 A1 * | 10/2011 | Murakami | 714/758 |
| 2011/0283162 A1 * | 11/2011 | Murakami | 714/758 |
| 2014/0189467 A1 * | 7/2014 | Oberg et al. | 714/769 |

* cited by examiner

METHOD AND APPARATUS FOR ERROR CORRECTION

INCORPORATION BY REFERENCE

This present disclosure claims the benefit of U.S. Provisional Application No. 61/757,867, "DVD Error Correction Coding Decoder Improvements" filed on Jan. 29, 2013, which is incorporated herein by reference in its entirety.

BACKGROUND

Defects in a digital versatile disc (DVD) can affect data stored on the DVD and introduce errors in the Data. Generally, the data is error-correction code (ECC) encoded before recorded on the DVD. The recorded data is read from the DVD and ECC decoded to correct the errors.

SUMMARY

Aspects of the disclosure provide a method for error correction. The method includes error-correction code (ECC) decoding a first code word of code words in a data block, determining erasures for a second code word of the code words in the data block based on corrections in the first code word by the ECC decoding, and ECC decoding the second code word with the erasures.

In an embodiment, the erasures are first erasures, and the method further includes determining second erasures that are different from the first erasures, and ECC decoding the second code word with the second erasures.

In an example, to determine the erasures for the second code word of the code words based on the corrections in the first code word, the method includes determining the erasures of the second code word that is ordered next to the first code word based on the corrections in the first code word.

According to an aspect of the disclosure, the code words are outer code words in the data block, and the ECC decoding is outer ECC decoding. In an example, the method further includes determining first erasures of the second code word based on failed inner ECC decoding of inner code words, first outer ECC decoding the second code word with the marked first erasures, determining second erasures of the second code word based on the corrections in the first code word when the first outer ECC decoding fails, and second outer ECC decoding the second code word with the second erasures.

In an embodiment, the code words are first dimension code words of the data block arranged in a multi-dimension matrix, and the method further includes determining locked bytes in the second code word based on succeeded ECC decoding of second dimension code words of the data block, and ignoring the ECC decoding of the second code word that makes corrections to the locked bytes. In an example, the method includes determining a byte of the second code word as locked when a number of corrections made by ECC decoding of a second dimension code word with the byte is less than a threshold. In another example, the method includes determining a byte of the second code word as locked when an ECC decoding of a second dimension code word with the byte succeeds without correction.

Aspects of the disclosure provide an apparatus with an input circuit and a decoder. The input circuit is configured to generate a data stream corresponding to a data block in response to a received signal. The decoder is configured to error-correction code (ECC) decode a first code word of code words in the data block, determine erasures for a second code word of the code words in the data block based on corrections in the first code word by the ECC decoding, and ECC decode the second code word with the erasures.

Aspects of the disclosure provide another method for error correction. The method includes error-correction code (ECC) decoding first dimension code words of a data block arranged in a multi-dimension matrix, determining locked bytes in second dimension code words of the data block based on succeeded ECC decoding of the first dimension code words, ECC decoding the second dimension code words, and ignoring a ECC decoding of a second dimension code word that makes corrections to the locked bytes in the second dimension code.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
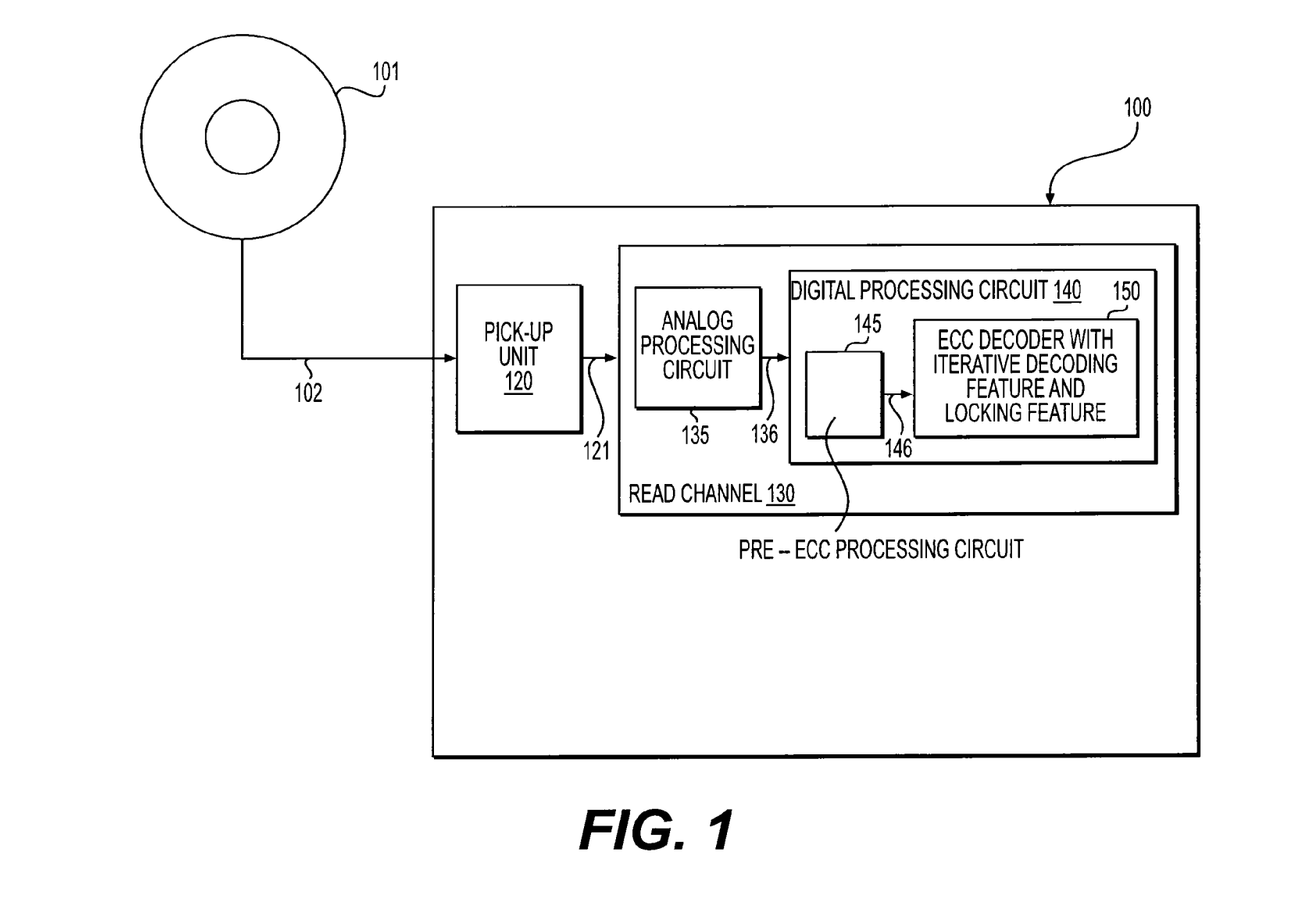
FIG. 1 shows a block diagram of an electronic device 100 according to an embodiment of the disclosure.

FIG. 1 shows a block diagram of an electronic device 100 according to an embodiment of the disclosure. The electronic device 100 includes an error-correction code (ECC) decoder 150 with features, such as an iterative decoding feature, a locking feature, and the like, to improve error correction performance.

In an embodiment, the ECC decoder receives a data sequence corresponding to data blocks that have been ECC encoded. In an example, each data block has a matrix of bytes in rows and columns. Bytes in a row form a row code word, and bytes in a column form a column code word. Each code word has been ECC encoded to incorporate additional information to assist recovery when errors are introduced. In an embodiment, the ECC decoder 150 is able to decode a code word by using a subset of the code word with a number of bytes being erased (erasures) from the code word.

According to an aspect of the disclosure, to decode a code word, such as a column code word, a row code word, and the like, the ECC decoder 150 is configured to use different techniques to generate different erasures, and repetitively decodes the code word using the different erasures until the code word is decoded with success or the ECC decoder 150 runs out of erasure generation techniques in an example. This feature is referred to as the iterative decoding feature.

According to another aspect of the disclosure, the decoding success information of the column code words and the row code words are exchanged to secure bytes with higher reliability of being correct to avoid false-correction. This feature is referred to as the locking feature.

The electronic device 100 can be any suitable device that operates on the received data. Specifically, in the FIG. 1 example, the electronic device 100 is a storage medium device configured to receive a storage medium 101, and read data from the storage medium 101. The electronic device 100 includes a pick-up unit 120 and a read channel 130 coupled together as shown in FIG. 1. The pick-up unit 120 receives a signal 102 and suitably generates an electrical signal 121 in response to the signal 102. The read channel 130 includes signal processing circuits to process the electrical signal 121, and extract data from the electrical signal 121.

It is noted that the storage medium 101 can be any suitable storage medium, such as an optical disc, a hard disc drive, a non-volatile memory, and the like. In an example, the storage medium 101 is a hard disk drive that stores data as magnetic field changes. The pick-up unit 120 includes a magnetic head that generates an electrical signal 121 in response to the magnetic field changes on the storage medium 101. The read channel 130 processes the electrical signal 121 and extracts the data.

In another example, the storage medium 101 is an optical disc, such as a compact disc (CD), a digital versatile disc (DVD), a Blu-ray disc, or the like, that stores data as optical property changes. The pick-up unit 120 is an optical pick-up unit that generates an electrical signal 121 in response to the optical property changes. Specifically, the pick-up unit 120 directs a light beam to the storage medium 101. The light beam is reflected from the storage medium 101. The signal 102, which is the reflected light beam, has light properties that correspond to the optical property changes on the storage medium 101. The pick-up unit 120 generates the electrical signal 121 in response to the light properties of the signal 102. The read channel 130 processes the electrical signal 121 and extracts the data.

It is noted that the electronic device 100 can receive data via other suitable ways, such as via electromagnetic waves in the air. For example, the pick-up unit 120 includes an antenna that generates an electrical signal 121 in response to the captured electromagnetic waves in the air. The read channel 130 processes the electrical signal 121 and extracts the data.

In the FIG. 1 example, the read channel 130 includes an analog processing circuit 135 and a digital processing circuit 140 coupled together as shown in FIG. 1. The analog processing circuit 135 receives the electrical signal 121, and processes the electrical signal using analog techniques. In an example, the analog processing circuit 135 uses analog techniques to shape the electrical signal, samples and converts the electrical signal into digital samples 136, and provides the digital samples 136 to the digital processing circuit 140.

The digital processing circuit 140 includes a pre-ECC processing circuit 145 and the ECC decoder 150 coupled together as shown in FIG. 1. The pre-ECC processing circuit 145 includes any suitable digital circuits configured to operate on the digital samples 136 and prepare a data stream 146 corresponding to data blocks to the ECC decoder 150 for ECC decoding. For example, the pre-ECC processing circuit 145 includes a Viterbi decoder (not shown) to make bit decision from the digital samples. In another example, the pre-ECC processing circuit 145 includes a decoding circuit for demodulating bits of eight-to-fourteen modulation (EFM).

Figure 2:
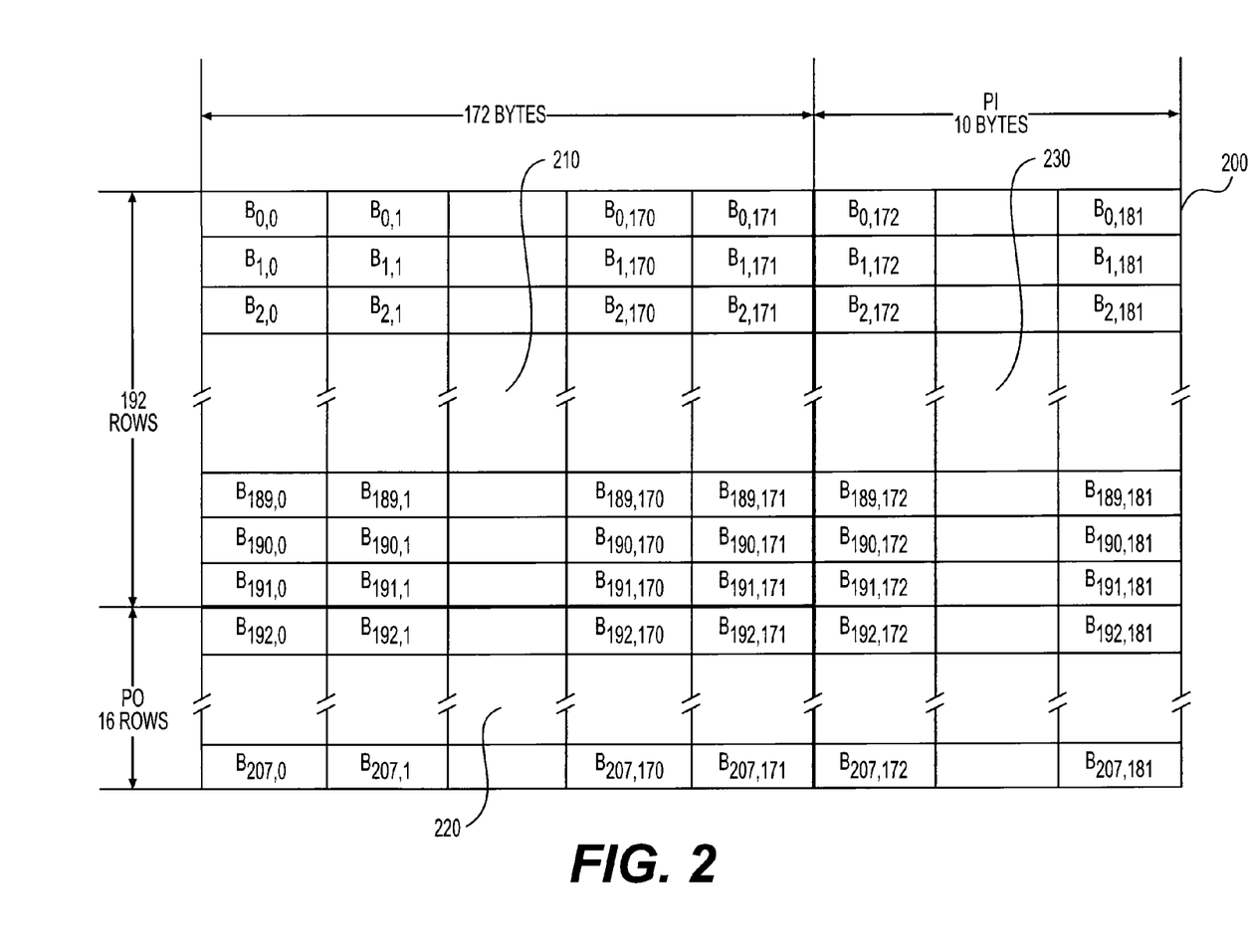
FIG. 2 shows a diagram of an error correction code (ECC) encoded block according to an embodiment of the disclosure.

The ECC decoder 150 receives the data stream 146 corresponding to data blocks that have been ECC encoded, such as a data block 200 in FIG. 2, and the like, and uses one or more of the features to improve decoding performance.

In FIG. 2, the data block 200 has been ECC encoded according a DVD format.

The block 200 includes a matrix of bytes. The matrix has 208 rows and 182 columns. The matrix includes a first sub-matrix 210 ($B_{0,0}$ to $B_{191,171}$), a second sub-matrix 220 ($B_{192,0}$ to $B_{207,171}$) and a third sub-matrix 230 ($B_{0,172}$ to $B_{207,181}$).

The bytes in the first sub-matrix 210 are user bytes organized into sixteen sectors. Each sector includes 2,064 bytes that occupy twelve rows in the first sub-matrix 210, and the last four bytes in the sector are error detection code (EDC) bytes for the sector. The EDC bytes can be used to detect whether the sector has errors.

The bytes in the second sub-matrix 220 are parity outer (PO) codes for the user data within the first sub-matrix 210 in the column direction. In the FIG. 2 example, for each column from column 0 to column 171, the bytes in the second sub-matrix 220 of the column are the PO codes for the user data in the first sub-matrix 210 of the column. The PO codes can be any suitable codes, such as Reed-Solomon (RS) codes, and the like. The PO codes incorporate additional information from the user data in columns. Bytes in each column of the block 200 form a column code word. The column code word is recoverable when errors are introduced in the column code word.

In an embodiment, the column code word is recoverable based on a subset of the column code word using a suitable decoding algorithm. For example, when $B_{0,0}$ is erased from column 0 (e.g., $B_{0,0}$ is an erasure), the column 0 can be fully recovered based on the rest of the bytes in column 0 using a suitable decoding algorithm.

The bytes in the third sub-matrix 230 are parity inner (PI) codes for the bytes in the first sub-matrix 210 and the second sub-matrix 220 in the row direction. In the FIG. 2 example, for each row from row 0 to row 191, the bytes in the third sub-matrix 230 of the row are the PI codes for the bytes in the first sub-matrix 210 of the row, and for each row from row 192 to row 207, the bytes in the third sub-matrix 230 of the row are the PI codes for the bytes in the second sub-matrix 220 of the row. The PI codes can be any suitable codes, such as Reed-Solomon (RS) codes, and the like. The PI codes incorporate additional information from the user data in rows. Bytes in each row of the block 200 form a row code word. The row code word is recoverable when errors are introduced in the row code word.

In an embodiment, the row code word is recoverable based on a subset of the row code word using a suitable decoding algorithm. For example, when $B_{0,0}$ is erased from row 0 (e.g., $B_{0,0}$ is an erasure), the row 0 can be fully recovered based on the rest of the bytes in row 0 using a suitable decoding algorithm.

According to an aspect of the disclosure, a decoding of a code word, such as a column code word, a row code word, and the like, can succeed or fail. When a decoding of a code word succeeds, the code word has no errors, or errors in the code word are corrected by the decoding. When a decoding of a code word fails, errors in the code word fail to be corrected. The decoding success information, such as the number of corrections with the decoding success, is also indicative of the level of reliability for the correctness of the decoded data. In an example, when a decoding of a code word succeeds without correction, the decoded code word has higher level of reliability of being correct than another decoding success case with one or more bytes being corrected.

Referring back to the FIG. 1 example, in an embodiment, the ECC decoder 150 receives the data stream corresponding to the block 200 row-by-row, and decodes the data block with the iterative decoding feature. In an example, the ECC decoder 150 is implemented with multiple techniques to generate erasures for column code words decoding. For example, to decode a column code word, the ECC decoder 150 uses a suitable sequence of the techniques to generate erasures, and repetitively decode the column code word until a decoding succeeds or until the ECC decoder 150 runs out of techniques. The iterative decoding feature is described in more detail with reference to FIG. 3.

In another embodiment, the ECC decoder 150 decodes the data block with the locking feature. In an example, the ECC decoder 150 is implemented with a PO-PI decoding loop. The PO-PI loop is repeated until the data block is successfully decoded or the PO-PI loop has been repeated for specific times. In each loop, the column code words are decoded (PO decoding), and then the row code words are decoded (PI decoding).

When the ECC decoder 150 performs PO decoding, the ECC decoder 150 secures bytes based on decoding success information from the PI decoding to avoid false-corrections; and when the ECC decoder 150 performs PI decoding, the ECC decoder 150 secures bytes based on decoding success information from the PO decoding to avoid false corrections. The locking feature is described in more detail with reference to FIG. 4.

It is noted that, in an embodiment, the ECC decoder 150 decodes using both the iterative decoding feature and the locking feature.

It is noted that the ECC decoder 150 can be implemented using any suitable technique. In an example, the ECC decoder 150 is implemented using integrated circuits. In another example, the ECC decoder 150 is implemented as a processor executing software instructions.

Figure 3:
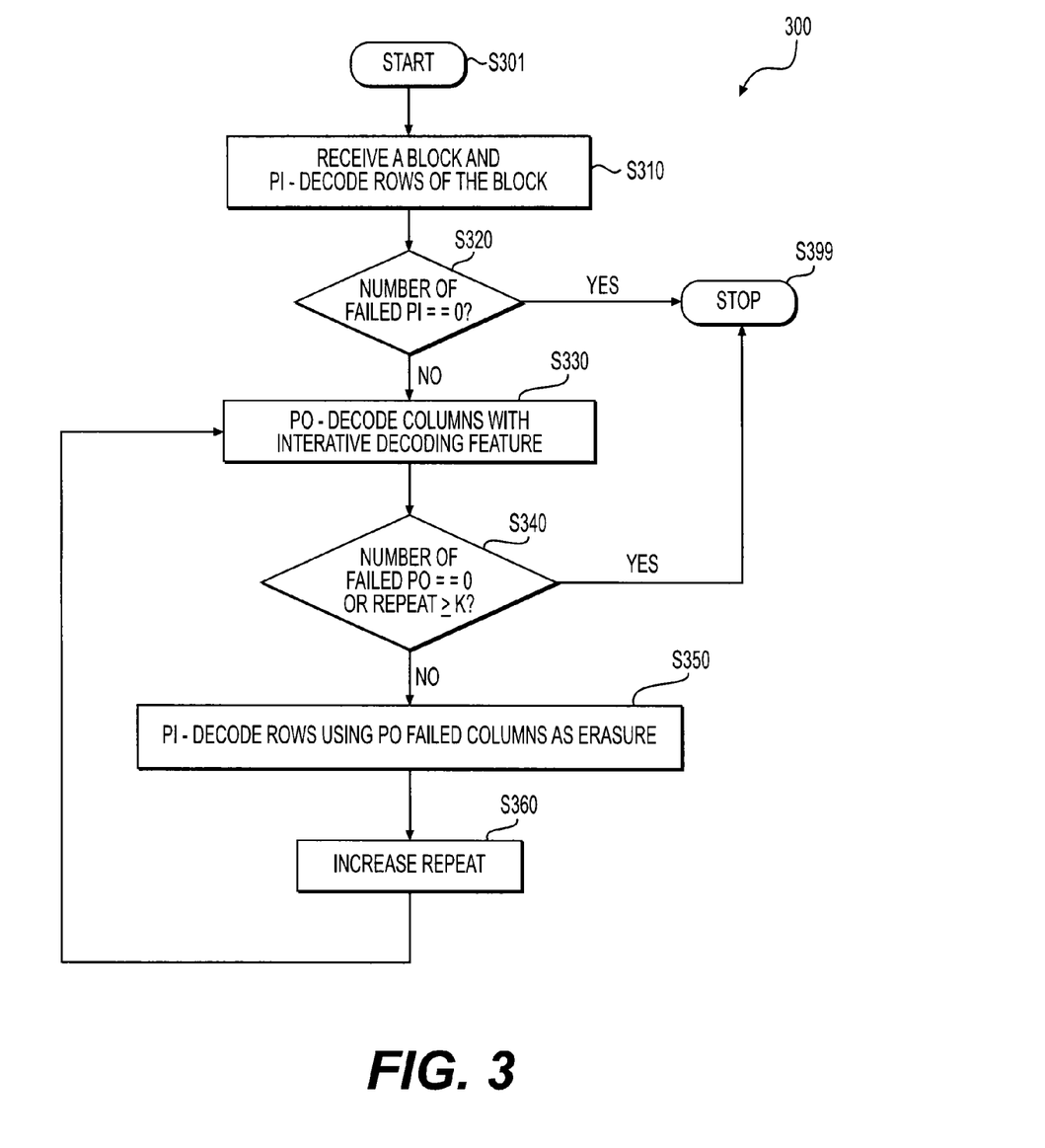
FIG. 3 shows a flow chart outlining a process 300 according to an embodiment of the disclosure.

FIG. 3 shows a flow chart outlining a process example 300 according to an embodiment of the disclosure. In an example, the process example 300 is executed by the ECC decoder 150 to decode a block 200 using the iterative decoding feature. The process starts at S301 and proceeds to S310.

At S310, a block is received and the block is PI-decoded. In the FIG. 1 example, the ECC decoder 150 receives a block 200 row-by-row, and decodes the row code words (PI decoding). When a row code word of 182 bytes is received, the ECC decoder 150 performs ECC decoding for the row code word. The ECC decoding succeeds or fails. In an example, the ECC decoding for the row code word succeeds without making corrections to any bytes in the row code word. In another example, the ECC decoding for the row succeeds with one or more bytes in the row code word being corrected. In another example, the ECC decoding for the row code word fails, and the row code word is marked for failing the ECC decoding.

At S320, the process branches based on the number of rows that fail the PI decoding. When all of the row code words succeed the PI decoding, the process proceeds to S399 and stops; when at least one of the row code words fails the PI decoding, the process proceeds to S330.

At S330, the block is PO-decoded with the iterative decoding feature. In the FIG. 1 example, the ECC decoder 150 decodes the column code words in the block 200 (PO decoding) with the iterative decoding feature. Specifically, the ECC decoder 150 repetitively performs ECC decoding for a column code word with different erasures (bytes that are not used for decoding) until the column code word succeeds the ECC decoding or until the ECC decoder 150 runs out of techniques to generate the erasures. The column code word fails the PO decoding when the multiple times of ECC decoding all fail.

In an example, the ECC decoder 150 can generate erasures using three techniques. In an example, when a row code word fails PI decoding, the bytes in the row code word are not reliable, and are used as erasures in the PO decoding. Thus, in a first technique, erasures are generated based on failed row code words in the PI decoding. In another example, neighboring bytes in a row code word suffer similar error-causing conditions, and when a byte in a column code word is corrected in a PO decoding, a neighboring byte in a neighboring column code word is not reliable and is used as an erasure in the PO decoding of the neighboring column. Thus, in a second technique, erasures are generated based on error-corrections in columns that succeed the PO decoding. In a third technique, no erasure is generated.

The ECC decoder 150 suitably selects the sequence of the techniques to generate the erasures, repetitively decodes a column with the erasures generated by different techniques until the column succeeds the ECC decoding or the column fails the ECC decoding for all the erasure generation techniques.

For example, at a first time to decode column j (j is an integer between 0 to 171), the first technique is used and the erasures are generated based on the failed rows in the PI decoding. For example, when row i (i is an integer between 0 and 207) fails the PI decoding, the byte at row i and column j ($B_{i,j}$) is determined as an erasure. Based on the erasures, column j is ECC decoded. When the ECC decoding succeeds, the ECC decoder 150 decodes next column. When the ECC decoding fails for the first time, the ECC decoder 150 decodes column j for a second time with different erasures.

In the example, at the second time to decode column j, the second technique is used and the erasures are generated based on ECC decoding of one or more other columns, such as column j−1, column j+1, and the like. For example, when column j−1 succeeds the ECC decoding with byte $B_{3,j-1}$ being error-corrected, then byte $B_{3,j}$ is used as an erasure to decode column j for the second time. When the ECC decoding succeeds, the ECC decoder 150 decodes next column. When the ECC decoding fails for the second time, the ECC decoder 150 decodes column j for a third time.

In the example, at the third time to decode column j, the third technique is used and no erasure is generated in the ECC decoding. When the ECC decoding succeeds, the ECC decoder 150 decodes next column. When the ECC decoding fail for the third time, and the ECC decoder 150 does not have any more technique to generate the erasures, the column fails the ECC decoding and the column (column code word) is marked for failing the ECC decoding.

In an embodiment, when column j fails the ECC decoding and subsequently column j+1 succeeds the ECC decoding, the ECC decoder 150 performs the ECC decoding on the column j again with erasures generated based on the error-corrections in column j+1.

At S340, the process proceeds differently based on the number of columns that fail the PO decoding. When all of the columns succeed the PO decoding or a PO-PI decoding loop (S330 to S360) has been repeated for specific times (K), the process proceeds to S399 and stops; otherwise, the process proceeds to S350.

At S350, the block is PI-decoded in rows with erasures determined based on failed columns in the PO decoding. In an example, to decode row i, the erasures are generated based on the failed columns in the PO decoding. For example, when column j fails the PO decoding, the byte at row i and column j ($B_{i,j}$) is determined as an erasure. Based on the erasures, row i is ECC decoded.

At S360, the PI-PO loop counter (repeat) is adjusted (e.g., increased). Then, the process returns to S330.

It is noted that the process 300 can be suitably modified. In an example, at S360, the process returns to S320. In another example, a step of checking EDC bytes for each sector is performed before S399.

Figure 4:
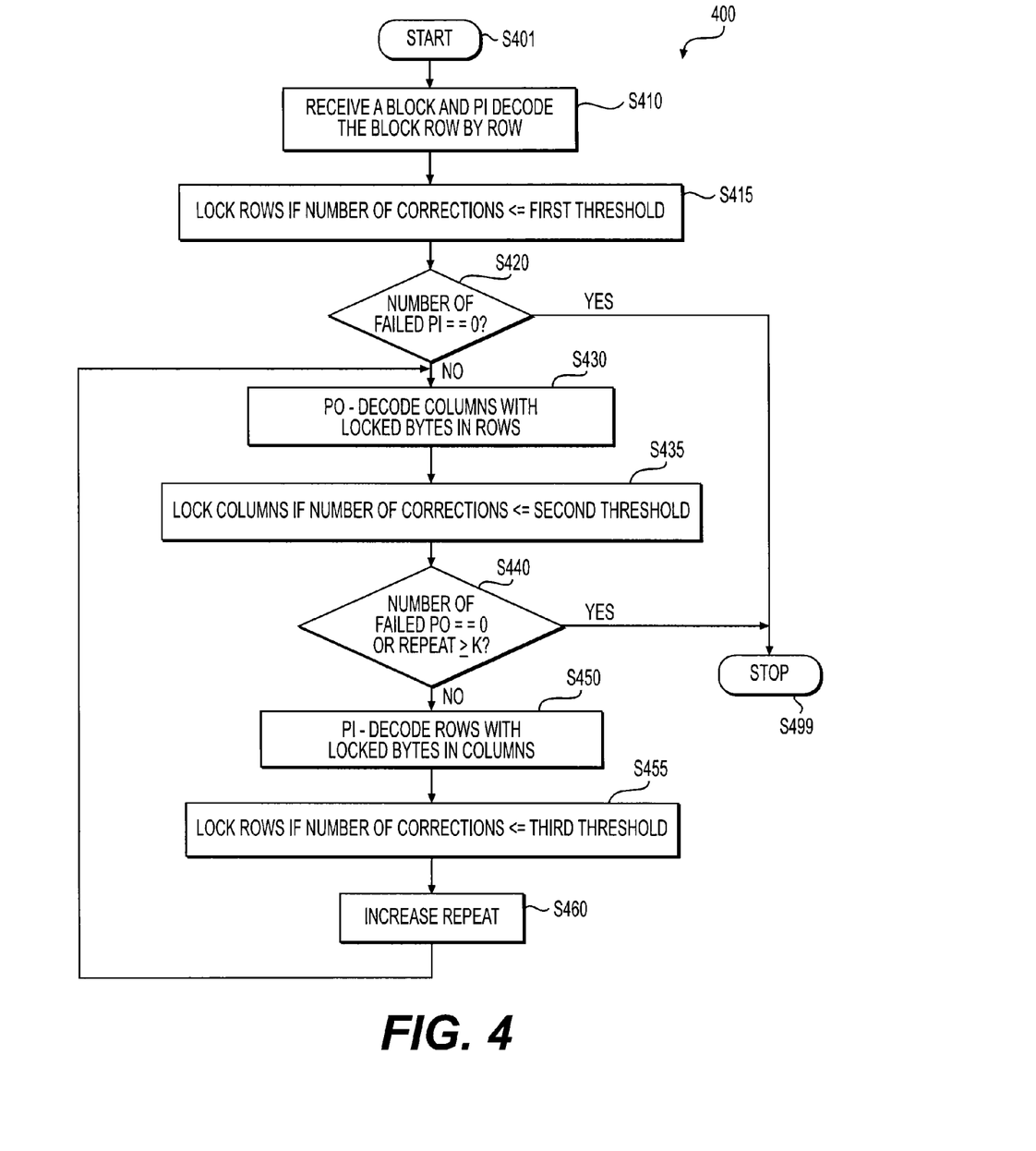
FIG. 4 shows a flow chart outlining a process 400 according to an embodiment of the disclosure.

FIG. 4 shows a flow chart outlining a process 400 according to an embodiment of the disclosure. In an example, the process 400 is executed by the ECC decoder 150 in FIG. 1 to decode a block 200 using the locking feature. The process starts at S401 and proceeds to S410.

At S410, a block is received and the block is PI-decoded. In the FIG. 1 example, the ECC decoder 150 receives a block 200 row-by-row, and decodes the row code words (PI decoding). When a row code word of 182 bytes is received, the ECC decoder 150 performs ECC decoding for the row code word. The ECC decoding succeeds or fails. In an example, the ECC decoding for the row code word succeeds without making corrections to any bytes in the row code word. In another example, the ECC decoding for the row succeeds with one or more bytes in the row code word being corrected. In another example, the ECC decoding for the row code word fails, and the row code word is marked for failing the ECC decoding.

At S415, based on the PI decoding, the rows with higher reliability are locked. Specifically, when a row (row code word) succeeds the PI decoding and the number of error-corrections is less than a threshold, such as a first threshold, the bytes in the row have a relatively high reliability of being correct, the row is locked (e.g., flagged for locked). In an example, when a row succeeds the PI decoding without error-correction, the bytes in the row are of relatively high level of being correct, and the row is locked.

At S420, the process proceeds differently based on the number of rows that fail the PI decoding. When all of the rows succeed the PI decoding, the process proceeds to S499 and stops; when at least one of the rows fails the PI decoding, the process proceeds to S430.

At S430, the block is PO-decoded in columns with the locked bytes in rows. The locked bytes are protected from changes during the PO-decoding. In an example, when row i is locked and the PO decoding of column j changes the byte at row I ($B_{i,j}$), the change is not allowed and the PO decoding of column j is ignored.

At S435, based on the PO decoding, the columns with higher reliability are locked. Specifically, when a column (column code word) succeeds the PO decoding and the number of error-corrections is less than a threshold, such as a second threshold, the bytes in the column have a higher level of reliability of being correct, and the column is locked (e.g., flagged for locked). In an example, when a column succeeds the PO decoding without error-correction, the bytes in the column are substantially correct, and the column is locked.

At S440, the process proceeds differently based on the number of columns that fail the PO decoding. When all of the columns succeed the PO decoding or a PO-PI decoding loop (e.g. from S430 to S460) has been repeated for specific times (K), the process proceeds to S499 and stops; otherwise, the process proceeds to S450.

At S450, the block is PI-decoded in rows with the locked bytes in columns. The locked bytes are protected from changes during the PI-decoding. In an example, when column j is locked and the PI decoding of row i changes the byte at column j ($B_{i,j}$), the change is not allowed and the PI decoding of row i is ignored.

At S455, based on the PI decoding, the rows with higher reliability are locked. Specifically, when a row succeeds the PI decoding and the number of error-corrections is less than a threshold, such as a third threshold, the bytes in the row have a higher level of reliability of being correct, and the row is locked. In an example, when a row succeeds the PI decoding without error-correction, the bytes are substantially correct, and the row is locked.

At S460, the PI-PO loop counter (repeat) is adjusted (e.g., increased). Then, the process returns to S430.

It is noted that the process 400 can be suitably modified. In an example, S455 is suitably removed, and at S460, the process returns to S415.

It is also noted that the process 300 and the process 400 can be suitably combined to decode with both the iterative feature and the locking feature. In an example, at S430, the block is PO-decoded in columns with the locked bytes in rows and with the iterative decoding feature. For example, the ECC decoder 150 repetitively performs ECC decoding for a column code word with locked bytes and with different erasures until the column code word succeeds the ECC decoding or until the ECC decoder 150 runs out of techniques to generate the erasures.

In a simulation example, 1709 blocks are decoded respectively using a related scheme, and a present disclosed scheme with both the iterative feature and the locking feature. The related scheme has a total of 1,094 blocks being successfully decoded without EDC failure. The present disclosed scheme has a total of 1,345 blocks being successfully decoded without EDC failure. The average number of EDC failure is about 1.28 per block for the related scheme, and is about 0.71 per block for the present disclosed scheme. Thus, the present disclosed scheme has better decoding performance.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method for error correction, comprising:
    error-correction code (ECC) decoding, implemented using integrated circuits, a first code word of code words in a data block;
    determining erasures for a second code word of the code words in the data block based on corrections in the first code word by the ECC decoding;
    ECC decoding the second code word with the erasures;
    determining erasures for the first code word based on corrections in the second code word by the ECC decoding; and
    ECC decoding the first code word with the erasures determined based on the corrections in the second code word.

2. The method of claim 1, wherein the erasures are first erasures, the method further comprises:
    determining second erasures that are different from the first erasures; and
    ECC decoding the second code word with the second erasures.

3. The method of claim 1, wherein determining the erasures for the second code word of the code words based on the corrections in the first code word further comprises:
    determining the erasures of the second code word that is ordered next to the first code word based on the corrections in the first code word.

4. The method of claim 1, wherein the code words are outer code words in the data block, and the ECC decoding is outer ECC decoding.

5. The method of claim 4, further comprising:
    determining first erasures of the second code word based on failed inner ECC decoding of inner code words;
    first outer ECC decoding the second code word with a marked first erasures;
    determining second erasures of the second code word based on the corrections in the first code word when the first outer ECC decoding fails; and
    second outer ECC decoding the second code word with the second erasures.

6. The method of claim 1, wherein the code words are first dimension code words of the data block arranged in a multi-dimension matrix, and the method further comprises:
- determining locked bytes in the second code word based on succeeded ECC decoding of second dimension code words of the data block; and
- ignoring the ECC decoding of the second code word that makes corrections to the locked bytes.

7. The method of claim 6, wherein determining the locked bytes in the second code word based on the succeeded ECC decoding of the second dimension code words of the data block further comprises:
- determining a byte of the second code word as locked when a number of corrections made by ECC decoding of a second dimension code word with the byte is less than a threshold.

8. The method of claim 6, wherein determining the locked bytes in the second code word based on the succeeded ECC decoding of the second dimension code words of the data block further comprises:
- determining a byte of the second code word as locked when an ECC decoding of a second dimension code word with the byte succeeds without correction.

9. An apparatus, comprising:
- an input circuit configured to generate a data stream for a data block in response to a received signal; and
- a decoder, implemented using integrated circuits, configured to error-correction code (ECC) decode a first code word of code words in the data block, determine erasures for a second code word of the code words in the data block based on corrections in the first code word by the ECC decoding, ECC decode the second code word with the erasures, determine erasures for the first code word based on corrections in the second code word by the ECC decoding, and ECC decode the first code word with the erasures determined based on the corrections in the second code word.

10. The apparatus of claim 9, wherein the erasures are first erasures, and the decoder is configured to determine second erasures that are different from the first erasures, and ECC decode the second code word with the second erasures.

11. The apparatus of claim 9, wherein the decoder is configured to determine the erasures of the second code word that is ordered next to the first code word based on the corrections in the first code word.

12. The apparatus of claim 9, wherein the code words are outer code words in the data block, and the ECC decoding is outer ECC decoding.

13. The apparatus of claim 12, wherein the decoder is configured to determine first erasures of the second code word based on failed inner ECC decoding of inner code words, first outer ECC decode the second code word with the marked first erasures, determine second erasures of the second code word based on the corrections in the first code word when the first outer ECC decoding fails, and second outer ECC decode the second code word with the second erasures.

14. The apparatus of claim 9, wherein the code words are first dimension code words of the data block arranged in a multi-dimension matrix, the decoder is configured to determine locked bytes in the second code word based on succeeded ECC decoding of second dimension code words of the data block, and ignore the ECC decoding of the second code word that makes corrections to the locked bytes.

15. The apparatus of claim 14, wherein the decoder is configured to determine a byte of the second code word as locked when a number of corrections made by ECC decoding of a second dimension code word with the byte is less than a threshold.

16. The apparatus of claim 14, wherein the decoder is configured to determine a byte of the second code word as locked when an ECC decoding of a second dimension code word having the byte succeeds without correction.

17. A method for error correction, comprising:
- error-correction code (ECC) decoding, implemented by integrated circuits, first dimension code words of a data block arranged in a multi-dimension matrix;
- determining locked bytes in second dimension code words of the data block based on succeeded ECC decoding of the first dimension code words;
- ECC decoding the second dimension code words; and
- ignoring a ECC decoding of a second dimension code word of the second dimension code words that makes corrections to the locked bytes in the second dimension code.

18. The method of claim 17, wherein determining the locked bytes in the second dimension code words of the data block based on the succeeded ECC decoding of the first dimension code words of the data block further comprises:
- locking bytes in a first dimension code word of the first dimension code words when a number of corrections made by the ECC decoding of the first dimension code word is less than a threshold.

19. The method of claim 17, wherein determining the locked bytes in the second dimension code words of the data block based on the succeeded ECC decoding of the first dimension code words of the data block further comprises:
- locking bytes in a first dimension code word of the first dimension code words when the ECC decoding of a first dimension code word succeeds without correction.

* * * * *